United States Patent [19]

Salvage et al.

[11] Patent Number: 4,700,153
[45] Date of Patent: Oct. 13, 1987

[54] PHASE-COMPENSATED FET ATTENUATOR

[75] Inventors: Seward T. Salvage, Palm Bay; Donald K. Belcher, West Melbourne; Charles D. Rosier, Melbourne, all of Fla.

[73] Assignee: Harris Corporation, Melbourne, Fla.

[21] Appl. No.: 818,082

[22] Filed: Jan. 13, 1986

[51] Int. Cl.⁴ ............................................. H03H 7/25
[52] U.S. Cl. .................... 333/81 R; 307/511; 307/262; 307/264; 307/568
[58] Field of Search ............... 307/540, 550, 568, 511, 307/262, 264; 333/81 R, 81 A

[56] References Cited

U.S. PATENT DOCUMENTS

| | | | |
|---|---|---|---|
| 3,369,129 | 2/1968 | Wolterman | 307/568 |
| 3,539,909 | 11/1970 | Morrison | 307/511 X |
| 3,649,847 | 3/1972 | Limberg | 307/262 X |
| 3,652,959 | 3/1972 | Denny | 333/81 R |
| 3,747,031 | 7/1973 | Ohm | 333/81 B |
| 4,092,617 | 5/1978 | Titus | 333/17 R |
| 4,511,813 | 4/1985 | Pan | 307/501 |

FOREIGN PATENT DOCUMENTS

| | | | |
|---|---|---|---|
| 0148706 | 7/1985 | European Pat. Off. | 333/21 A |
| 0039349 | 3/1977 | Japan | 307/544 |

OTHER PUBLICATIONS

Mondal et al; "Phase Shifts in Single and Dual Gate GaAs MESFET for 2–4 GHz Quadrature Phase Shifters"; *IEEE Transactions on Microwave Theory and Techniques;* vol. MTT32, No. 10, 10/1984, pp. 1280–1287.

Primary Examiner—Eugene R. Laroche
Assistant Examiner—Benny Lee
Attorney, Agent, or Firm—Antonelli, Terry & Wands

[57] ABSTRACT

A dual gate MESFET attenuator circuit provides substantial range of attenuation without phase shift through a cascaded arrangement of a pair of dual gate MESFETs and the incorporation of a feed forward resistor. By cascading the two transistors together, the attenuation vector characteristics are effectively rotated 180° or shifted to the third and fourth quadrants of the (real-/imaginary) vector plane. The resulting phase shift between the minimum attenuation vector and the maximum attenuation vector is compensated by the insertion of a pure resistance component in a feed forward fashion between the input and output terminals of the cascaded dual MESFET pair. The value of the inserted resistor is chosen so as to effectively make both the maximum attenuation vector and the minimum attenuation vector cophasal, thereby providing a constant phase shift through the attenuator over a substantial range of attenuation.

17 Claims, 7 Drawing Figures

PHASE-COMPENSATED FET ATTENUATOR

FIELD OF THE INVENTION

The present invention relates to communication systems and is particularly directed to a dual gate field effect transistor attenuator which enjoys effectively constant phase shift over a prescribed range of attenuation.

BACKGROUND OF THE INVENTION

Adaptive signal processing systems, such as adaptive array antennas, may employ several thousand complex weights for steering an antenna beam (or beams). In microwave communication systems, in which a number of different elements are combined to meet the functional demands of the system, component fabrication has taken the form of monolithic microwave integrated circuits (MMICs) which offer low cost, miniaturization and high reliability. In such circuits, semiconductor material such as gallium arsenide, indium phosphide and other III–V components make it possible to integrate a large number of signal processing elements to meet the needs of the system. One type of signal processing component which has enjoyed use in complex weight networks in such systems is the dual gate field effect transistor (e.g. dual gate MESFET).

A schematic diagram of a dual gate FET and the attenuation characteristics thereof are shown in FIGS. 1 and 2, respectively. For purposes of the present description, the dual gate FET 10 is considered to be a dual gate MESFET having a pair of gate electrodes 11 and 12, and respective source (drain) and drain (source) electrodes 13 and 14. When the dual gate FET 10 is used as a microwave attenuator device an RF input signal is applied to input gate 11 while the second gate 12 is coupled to a control voltage for adjusting the attenuation provided by the MESFET at output (drain) electrode 13. The source electrode 14 is coupled to a source of reference potential (ground) as shown.

In operation, in response to a variation in a DC control voltage applied to control gate 12, the attenuation of the input signal applied to the second gate 11 varies from a minimum value represented by minimum attenuation vector 21, shown in FIG. 2, to a maximum value represented by maximum attenuation vector 22. Here, the degree of attenuation is assumed to be greater than 15 dB and there is a substantial phase shift $\phi 1$ between the minimum attenuation vector 21 and the maximum attenuation vector 22, caused primarily by the lowering of the transconductance of the MESFET as the depletion region beneath the second gate is widened with the increase in control voltage. (As pinch-off is approached, other parameters (e.g. intrinsic resistance, capacitance) are varied in a complex interaction to produce a net effect of a rotation of the attenuation vector through phase shift angle $\phi 1$.) As a result, conventional dual gate MESFET attenuators are not practically useful in complex weighting devices where a substantial amount of attenuation (on the order of 40 dB) is required with minimal phase shift over that attenuation range.

SUMMARY OF THE INVENTION

In accordance with the present invention, the inability of a conventional dual gate MESFET attenuator to provide a substantial range of attenuation without phase shift is obviated by a cascaded arrangement of dual gate MESFETs and the incorporation of a feed forward resistor. By cascading the two transistors together, the attenuation vector characteristics are effectively rotated 180° or shifted to the third and fourth quadrant of the (real/imaginary) vector plane. The location of the maximum and minimum attenuation vectors in the third or fourth quadrants allows compensation with practical components. A resistor may be placed in parallel with the cascaded FETs thereby creating a real component which adds vectorially to the maximum attenuation vector. The resistor is chosen such that the resultant vector lines up with the minimum attenuation vector. This effectively makes both the maximum attenuation vector and the minimum attenuation vector cophasal, thereby providing a constant phase shift through the attenuator over a substantial range (e.g. 40 dB) of attenuation. Because of the lack of phase change, the present invention is particularly useful in an adaptive array antenna system where constant phase attenuators are required for providing extremely deep nulls and a less complicated signal process mechanism.

DETAILED DESCRIPTION

Figure 3:
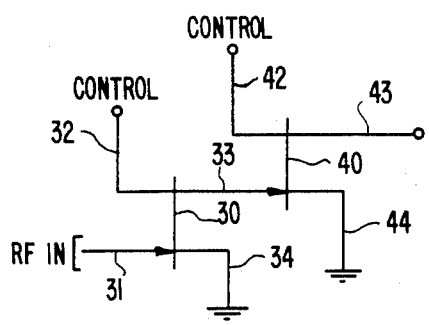
FIG. 3 shows a cascaded dual gate MESFET attenuator circuit.
Figure 4:
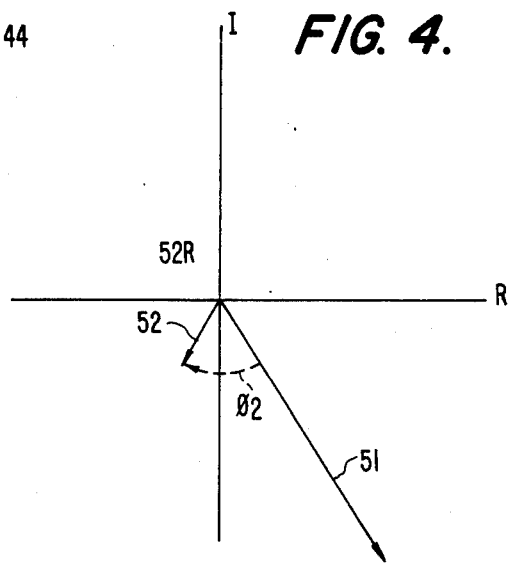
FIG. 4 is a vector diagram of the attenuation/phase shift characteristics of the cascaded dual gate FET attenuator of FIG. 3.

Referring now to FIG. 3, there is shown a cascaded arrangement of a pair of dual gate field effect transistors 30 and 40. FIG. 4 is a vector diagram showing the resulting attenuation/phase shift of the S21 parameter between input link 31, which is coupled to one gate of MESFET 30, and output link 43, which is coupled from the drain of MESFET 40. The second gate of MESFET 30 is coupled to a control electrode 32, while its source electrode is coupled to a reference potential (ground) via link 34. The drain of MESFET 30 is coupled over link 33 to one of the gates of MESFET 40. A control voltage for controlling the attenuation of MESFET 40 is coupled over link 42 to a second gate of the MESFET. The source of MESFET 40 is coupled via link 44 to ground, while its drain is coupled to link 43, as mentioned above. Links 42 and 32 may be connected together for operation from one control voltage.

Figure 1:
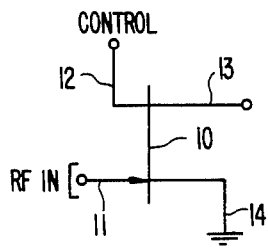
FIG. 1 is a schematic diagram of a conventional dual gate MESFET attenuator.
Figure 2:
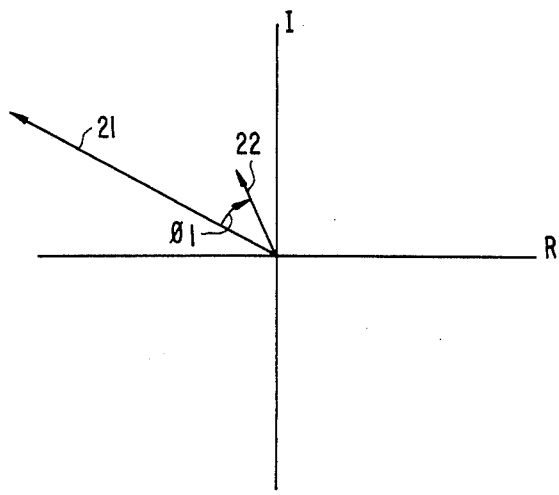
FIG. 2 is a vector diagram showing attenuation/phase shift characteristics of the dual gate FET attenuator of FIG. 1.

By cascading the dual gate MESFETs in the manner shown in FIG. 3, there is substantially a 180° phase shift of the attenuation vector diagram from the second quadrant to the third and fourth quadrants, as shown in FIG. 4. More specifically, the minimum attenuation (maximum gain) vector 51 is shown as lying in the fourth quadrant, while the maximum attenuation (minimum gain) vector 52 lies in the third quadrant. A clockwise phase shift φ2 exists between the minimum attenuation vector 51 and maximum attenuation vector 52. Compared to the circuit and attenuation diagram of the dual gate MESFET circuit shown in FIGS. 1 and 2, respectively, the attenuation range is effectively doubled, as is the degree of rotation φ2 between the maximum and minimum gain vectors. However, as noted above, because the resulting vector diagram exists in the third or fourth quadrants, it is possible to provide compensation for the rotation of the attenuation vector.

Figure 5:
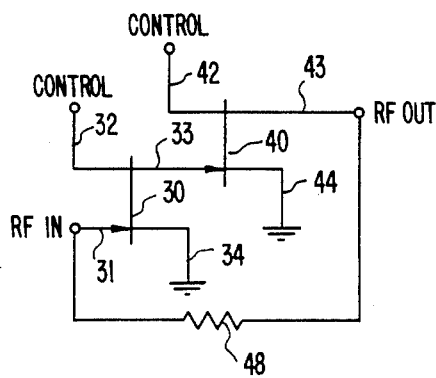
FIG. 5 is a schematic diagram of a cascaded dual gate FET attenuator employing a phase shift compensating feed forward conductance.
Figure 6:
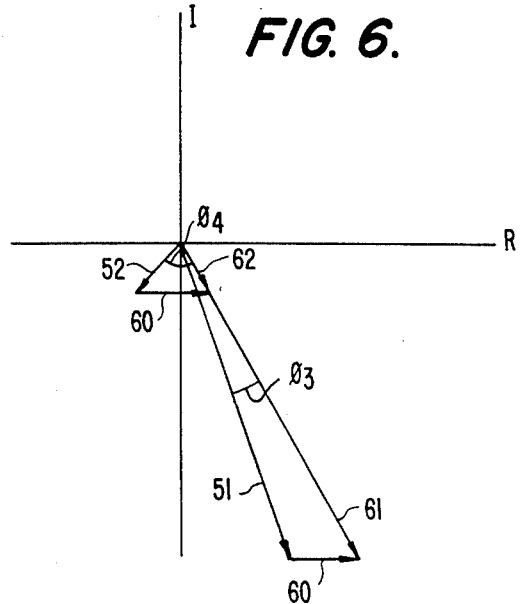
FIG. 6 is a vector diagram showing the attenuation/phase shift characteristics of the dual gate cascaded FET attenuator of FIG. 7.

For this purpose, as shown in FIG. 5, a real conductance (effectively pure resistance) 48 is coupled in a feed forward path between input terminal 31 and output terminal 43. The value of the resistance 48 is chosen to add vectorially to the maximum attenuation vector 52 such that the phase of the resultant is identical with that of the minimum attenuation vector 51. This is shown in FIG. 6. When added to vector 51, the resultant minimum attenuation vector 61 undergoes a slight counter-clockwise rotation φ3 from vector 51. However, the same real conductance vector component 60, when added to maximum attenuation vector 52, causes a substantially larger rotation φ4 between the resultant vector 62 and maximum attenuation vector 52. As shown in FIG. 6, both vectors 61 and 62 are cophased, or effectively have no phase shift therebetween. Namely, for the cascaded circuit configuration shown in FIG. 6, the attenuation vector will not rotate as the attenuation increases from the maximum value (represented by attenuation vector 62) to a minimum (represented by attenuation vector 61).

In a practical embodiment of the invention NE 463 dual gate MESFETs manufactured by Nippon Electric Corporation cascaded in the manner shown in FIG. 5 with a real resistance 48 having a value in the range of 3–5KΩ provide a range of attenuation on the order 40 dB over a frequency range of 900–1,600 MHz. While the phase of the attenuation vector for one operating frequency may differ from that of another operating frequency, for a particular frequency, over the attenuation range of interest, the phase is not effectively changed. As a result, the invention effectively provides a substantial range of attenuation at some constant phase over that range.

Figure 7:
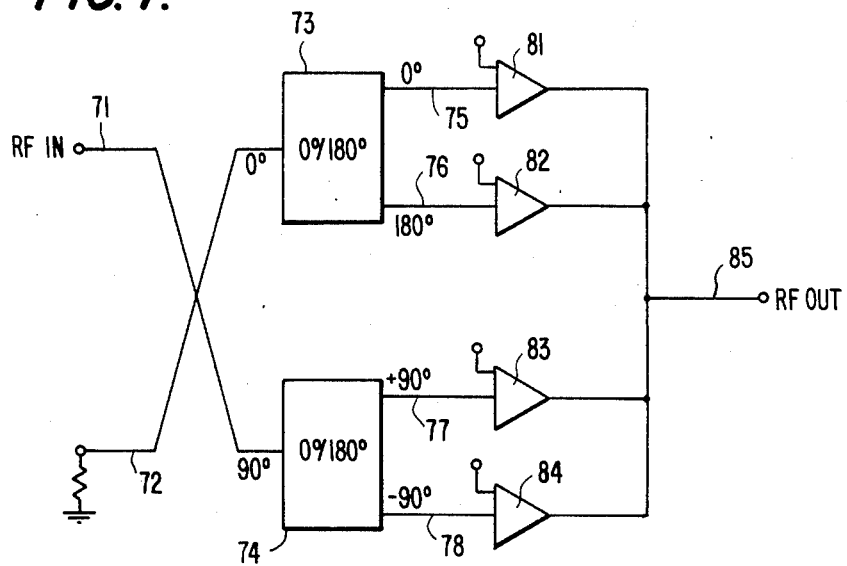
FIG. 7 shows a complex weight device employing a constant-phase, dual-gate cascaded FET attenuator of FIG. 5.

FIG. 7 illustrates an example of an embodiment of the application of the invention into a complex weight device such as may be used in a steerable antenna system. The incoming signal of interest is coupled to a 0°/90° hybrid circuit comprised of coupling lines 71 and 72, line 71 being coupled to receive an RF input signal, while line 72 is coupled through a suitable impedance (e.g. 50 Ω) to a reference potential (ground). Lines 71 and 72 are coupled to respective 0°/180° phase splitters 73 and 74 to produce four quadrature vector signals (0°, 180°, +90°, −90°) on links 75, 76, 77 and 78, as shown. These quadrature vector signals are coupled to cascaded dual gate MESFET constant phase attenuators 81-84, respectively, each of the type shown in FIG. 5, described above. By setting the control voltage of each respective attenuator, a prescribed degree of attenuation may be applied to each of the four quadrature vectors on links 75-78, with each vector undergoing effectively no phase shift through the attenuator. The outputs of the attenuators 81-84 are then combined or summed and applied to link 85 to provide a controlled amplitude/constant phase output.

As will be appreciated from the foregoing description, the shortcomings of a conventional dual gate MESFET attenuator which produces a clockwise phase rotation between maximum and minimum gain (minimum and maximum attenuation) is circumvented by cascading a pair of dual gate MESFETs together and incorporating a feed forward conductance between the input and output to oppose the negative real component of the phase vector rotation. Advantageously, because the constant phase attenuator can be implemented in monolithic microwave integrated circuit form, it enjoys an application to a wide variety of present day communication circuits including those employed in complex adaptive signal processing environment such as steerable antenna arrays.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A signal coupling circuit comprising:
   an input terminal to which a signal, the amplitude of which is to be varied, is applied;
   an output terminal from which a variable amplitude signal is derived;
   a plurality of dual gate field effect devices connected in cascade between said input and output terminals; and
   means, coupled to said cascade-connected devices, for causing said variable amplitude output signal derived from said output terminal to have a phase which is effectively constant irrespective of the variation of its amplitude over the range of operation of said circuit.

2. A signal coupling circuit according to claim 1, wherein said means comprises a resistance element connected in a feed forward fashion between said input and output terminals.

3. A signal coupling circuit according to claim 1, wherein each of said devices has one gate thereof coupled to a control voltage terminal for controlling the amplitude of a signal coupled therethrough.

4. A signal coupling circuit according to claim 3, wherein said means comprises a resistance element connected in a feed forward fashion between said input and output terminals.

5. A signal coupling circuit according to claim 4, wherein each of said devices comprises a dual gate MESFET.

6. A signal coupling circuit comprising:
   an input terminal;
   an output terminal;
   a first dual gate field effect transistor having a first gate electrode coupled to said input terminal, a second gate electrode coupled to receive a control voltage, a source/drain electrode coupled to receive a source reference potential, and a drain/source electrode;
   a second dual gate field effect transistor having a first gate electrode coupled to the drain/source electrode of said first field effect transistor, a second gate electrode coupled to receive a control voltage, a source/drain electrode coupled to receive a source of reference potential, and a drain/source electrode coupled to said output terminal; and a resistance element coupled between said input terminal and said output terminal.

7. A signal coupling circuit according to claim 6, wherein each of said first and second dual gate field effect transistors comprises a dual gate MESFET.

8. A signal coupling circuit according to claim 6, wherein the second gate electrodes of said first and second transistors are coupled to a common source of control voltage.

9. For use with signal amplitude control circuit containing a first dual gate field effect transistor for controlling the amplitude of a signal applied to a first gate electrode thereof by the application of a control voltage to a second gate electrode thereof, a method of maintaining the phase of the output signal produced by said circuit at a constant value for changes in the variation of the amplitude of said signal as controlled by said control voltage comprising the steps of:

(a) coupling said first dual gate field effect transistor in cascade with a second dual gate field effect transistor, a first gate electrode of said second dual gate field effect transistor being coupled to receive said control voltage, and a drain/source electrode of said second dual gate field effect transistor providing an output signal, the amplitude of said output signal is controlled by said control voltage and is derived as the output of said amplitude control circuit; and (b) coupling a signal transfer element having a real conductance electrical component between said first gate electrode of said first dual gate field effect transistor and said drain/source electrode of said second dual gate field effect transistor.

10. A method according to claim 9, wherein each of said first and second dual gate field effect transistors comprises a dual gate MESFET.

11. A method according to claim 9, wherein step (a) comprises coupling a second gate electrode of said second dual gate field effect transistor to a drain/source electrode of said first dual gate field effect transistor.

12. A method according to claim 9, wherein said signal transfer element comprises a resistive element.

13. For use in a microwave signal processing network wherein an input signal is coupled to a plurality of complex weighting devices and subjected to a controlled amplitude modification by a respective control voltage applied thereto, the outputs of said complex weighting devices being combined with one another, a respective one of said devices comprising:

an input terminal;
an output terminal;
a first dual gate field effect transistor having a first gate electrode coupled to said input terminal, a second gate electrode coupled to receive a respective control voltage, a source/drain electrode coupled to receive a source reference potential, and a drain/source electrode;

a second dual gate field effect transistor having a first gate electrode coupled to the drain/source electrode of said first field effect transistor, a second gate electrode coupled to receive a said respective control voltage, a source/drain electrode coupled to receive a source of reference potential, and a drain/source electrode coupled to said output terminal; and a resistance element coupled between said input terminal and said output terminal.

14. A device according to claim 13, wherein each of said first and second dual gate field effect transistors comprises a dual gate MESFET.

15. A signal coupling circuit comprising:
an input terminal;
an output terminal;
a plurality of dual gate field effect devices coupled in cascade between said input and output terminals and respective gate electrodes of which are coupled to receive a control voltage for controlling the signal transfer characteristic thereof between said input and output terminals, said signal transfer characteristic corresponding to a variation between a first attenuation vector at a first phase angle and a second attenuation vector at a second phase angle shifted from said first phase angle over a range of control voltage defining the range of operation of said circuit; and means, coupled to said cascade-coupled dual gate field effect devices, for effectively compensating for the shift in phase angle between said first and second phase angles of said signal transfer characteristic over said range of operation of said circuit.

16. A signal coupling circuit according to claim 15, wherein said means comprises a resistance element connected in a feed forward fashion between said input and output terminals.

17. A signal coupling circuit according to claim 15, wherein each of said devices comprises a dual gate MESFET.

* * * * *